United States Patent
Saito et al.

(10) Patent No.: US 9,029,915 B2
(45) Date of Patent: May 12, 2015

(54) NITRIDE SEMICONDUCTOR DEVICE

(71) Applicant: Kabushiki Kaisha Toshiba, Minato-ku (JP)

(72) Inventors: Wataru Saito, Kanagawa-ken (JP); Hidetoshi Fujimoto, Kanagawa-ken (JP); Takao Noda, Kanagawa-ken (JP); Yasunobu Saito, Tokyo (JP); Tomohiro Nitta, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/764,850

(22) Filed: Feb. 12, 2013

(65) Prior Publication Data

US 2013/0153966 A1    Jun. 20, 2013

Related U.S. Application Data

(62) Division of application No. 12/104,818, filed on Apr. 17, 2008, now Pat. No. 8,390,030.

(30) Foreign Application Priority Data

May 2, 2007 (JP) .................................. 2007-121352

(51) Int. Cl.
*H01L 29/78* (2006.01)
*H01L 29/778* (2006.01)
(Continued)

(52) U.S. Cl.
CPC .............. *H01L 29/78* (2013.01); *H01L 29/778* (2013.01); *H01L 29/7786* (2013.01);
(Continued)

(58) Field of Classification Search
CPC ... H01L 29/778; H01L 29/7786; H01L 29/78; H01L 29/8618; H01L 29/872
USPC .......................................... 257/194, E29.033
See application file for complete search history.

(56) References Cited

U.S. PATENT DOCUMENTS 4,680,600 A   7/1987   Tahara et al.
5,602,404 A   2/1997   Chen et al.
(Continued)

FOREIGN PATENT DOCUMENTS

JP   2003-229566   8/2003
JP   2006-73802    3/2006
(Continued)

OTHER PUBLICATIONS

Japanese Office Action mailed Dec. 21, 2009 for Japanese Application No. 2007-121352 (with English translation).

*Primary Examiner* — Mohammad Islam
*Assistant Examiner* — John P Dulka
(74) *Attorney, Agent, or Firm* — Oblon, McClelland, Maier & Neustadt, L.L.P.

(57) ABSTRACT

A semiconductor device includes: a first semiconductor layer made of an $Al_xGa_{1-x}N$ ($0 \leq x < 1$); a second semiconductor layer provided on the first semiconductor layer and made of an undoped or first conductivity type $Al_yGa_{1-y}N$ ($0 < y \leq 1$, $x < y$); an anode electrode and a cathode electrode which are connected to the second semiconductor layer; and a third semiconductor layer of second conductivity type provided between the anode electrode and the cathode electrode when viewed from a direction perpendicular to an upper surface of the second semiconductor layer. The third semiconductor layer is depleted when a predetermined magnitude or more of voltage is applied between the anode electrode and the cathode electrode.

20 Claims, 17 Drawing Sheets

(51) Int. Cl.
  H01L 29/861 (2006.01)
  H01L 29/872 (2006.01)
  H01L 29/06 (2006.01)
  H01L 29/10 (2006.01)
  H01L 29/20 (2006.01)
  H01L 29/205 (2006.01)
  H01L 29/40 (2006.01)

(52) U.S. Cl.
  CPC ........ *H01L 29/0619* (2013.01); *H01L 29/0692* (2013.01); *H01L 29/1033* (2013.01); *H01L 29/2003* (2013.01); *H01L 29/205* (2013.01); *H01L 29/402* (2013.01); *H01L 29/7787* (2013.01); *H01L 29/8618* (2013.01); *H01L 29/872* (2013.01)

(56) References Cited

U.S. PATENT DOCUMENTS

| | | | |
|---|---|---|---|
| 6,768,138 B1 | 7/2004 | Kitada et al. | |
| 6,949,401 B2 * | 9/2005 | Kaminski et al. | 438/92 |
| 7,038,252 B2 | 5/2006 | Saito et al. | |
| 7,211,839 B2 | 5/2007 | Kachi et al. | |
| 7,271,429 B2 | 9/2007 | Saito et al. | |
| 7,777,257 B2 * | 8/2010 | Khemka et al. | 257/281 |
| 2005/0189559 A1 | 9/2005 | Saito et al. | |
| 2005/0194612 A1 | 9/2005 | Beach | |
| 2005/0230705 A1 | 10/2005 | Taylor | |
| 2006/0043501 A1 * | 3/2006 | Saito et al. | 257/401 |
| 2006/0138454 A1 | 6/2006 | Saito et al. | |
| 2007/0051979 A1 * | 3/2007 | Kambayashi et al. | 257/194 |
| 2007/0200143 A1 | 8/2007 | Saito et al. | |
| 2007/0249119 A1 | 10/2007 | Saito | |
| 2007/0295993 A1 * | 12/2007 | Chen et al. | 257/194 |
| 2008/0191305 A1 * | 8/2008 | Khemka et al. | 257/481 |

FOREIGN PATENT DOCUMENTS

| | | |
|---|---|---|
| JP | 2007-59882 | 3/2007 |
| JP | 2008-166640 | 7/2008 |

* cited by examiner $c < d$

NITRIDE SEMICONDUCTOR DEVICE

CROSS-REFERENCE TO RELATED APPLICATIONS

This application is a Division of and claims the benefit of priority under 35 U.S.C. §120 from U.S. Ser. No. 12/104,818, filed Apr. 17, 2008 and is based upon and claims the benefit of priority from the prior Japanese Patent Application No. 2007-121352, filed on May 2, 2007; the entire contents of which are incorporated herein by reference.

BACKGROUND OF THE INVENTION

1. Field of the Invention

This invention relates to a semiconductor device and particularly relates to a semiconductor device having a horizontal-type nitride semiconductor element.

2. Background Art

Gallium nitride (GaN) has a larger band gap than that of silicon (Si), and therefore, a semiconductor element in which GaN is used has a higher critical electric field than that of a semiconductor element in which Si is used, and the element having a small size and a high breakdown voltage can be easily realized. Therefore, when a semiconductor element (power element) for controlling power is manufactured by using GaN, the element having low ON resistance and small loss can be realized. In particular, a HFET (heterostructure field-effect transistor) in which an AlGaN/GaN heterostructure is used has a simple element structure, and good characteristics can be expected (for example, JP-A 2003-229566 (Kokai)).

On the other hand, in the power supply circuit, a surge voltage is occasionally applied in power supply activation or the like. In this case, a breakdown voltage or more of voltage is occasionally applied to a power element in the power supply circuit. In a conventional power element in which Si is used, avalanche breakdown occurs by application of voltage of breakdown voltage or more to the p-n junction surface, and a current can be flowed while holding high voltage. Thereby, the power input by the surge is consumed in the power element to prevent the power element from breaking down, and parts except for the power element in the power circuit can also be prevented from breaking down.

However, in the above-described nitride semiconductor element in which GaN or the like is used, the p-type semiconductor layer has high contact resistivity, and therefore, even when avalanche breakdown occurs, a large avalanche current cannot be flowed. Therefore, even when the avalanche breakdown occurs, capacity of consuming the surge power is low, and high surge resistance cannot be obtained.

SUMMARY OF THE INVENTION

According to an aspect of the invention, there is provided a semiconductor device including: a first semiconductor layer made of an $Al_xGa_{1-x}N$ ($0 \leq x < 1$); a second semiconductor layer provided on the first semiconductor layer and made of an undoped or first conductivity type $Al_yGa_{1-y}N$ ($0 < y \leq 1$, $x < y$); an anode electrode and a cathode electrode which are connected to the second semiconductor layer; and a third semiconductor layer of second conductivity type provided between the anode electrode and the cathode electrode when viewed from a direction perpendicular to an upper surface of the second semiconductor layer, the third semiconductor layer being depleted when a predetermined magnitude or more of voltage is applied between the anode electrode and the cathode electrode.

According to another aspect of the invention, there is provided a semiconductor device including: a first semiconductor element; and a second semiconductor element, the first semiconductor element including: a first semiconductor layer made of an $Al_xGa_{1-x}N$ ($0 \leq x < 1$); a second semiconductor layer provided on the first semiconductor layer and made of an undoped or first conductivity type $Al_yGa_{1-y}N$ ($0 < y \leq 1$, $x < y$); an anode electrode and a cathode electrode which are connected to the second semiconductor layer; and a third semiconductor layer of second conductivity type provided between the anode electrode and the cathode electrode when viewed from a direction perpendicular to an upper surface of the second semiconductor layer, the second semiconductor element including: a fourth semiconductor layer made of an undoped $Al_zGa_{1-z}N$ ($0 \leq z < 1$); a fifth semiconductor layer provided on the fourth semiconductor layer and made of an undoped or first conductivity type $Al_uGa_{1-u}N$ ($0 < y \leq 1$, $z < u$); and a source electrode and a drain electrode which are connected to the fifth semiconductor layer, the anode electrode being connected to the source electrode, and the cathode electrode being connected to the drain electrode, and the third semiconductor layer being depleted when a predetermined magnitude or more of voltage is applied between the anode electrode and the cathode electrode.

According to still another aspect of the invention, there is provided a semiconductor device including: a first semiconductor layer made of an $Al_xGa_{1-x}N$ ($0 \leq x < 1$); a second semiconductor layer provided on the first semiconductor layer and made of an undoped or first conductivity type $Al_yGa_{1-y}N$ ($0 < y \leq 1$, $x < y$); an anode electrode, a cathode electrode, and a source electrode which are connected to the second semiconductor layer; and a third semiconductor layer of second conductivity type provided between the anode electrode and the cathode electrode when viewed from a direction perpendicular to an upper surface of the second semiconductor layer, the third semiconductor layer being depleted when a predetermined magnitude or more of voltage is applied between the anode electrode and the cathode electrode.

DETAILED DESCRIPTION OF THE INVENTION

Figure 1:
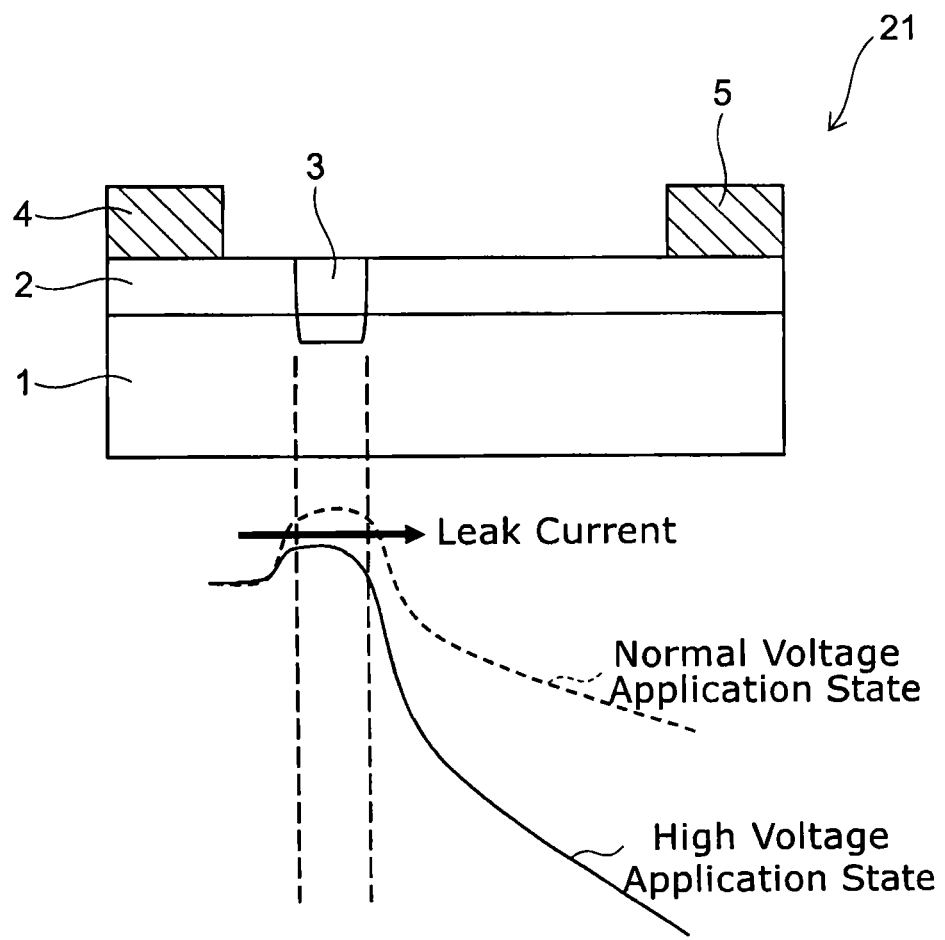
FIG. 1 is a cross-sectional view illustrating a semiconductor device according to a first embodiment of the invention.

Hereinafter, embodiments of the invention will be described with reference to drawings. The same numerals are appended to the same or corresponding parts in the drawings.

First Embodiment

FIG. 1 is a cross-sectional view schematically illustrating the configuration of a semiconductor device according to a first embodiment of the invention. In FIG. 1, potential distribution in an element is also schematically shown.

As shown in FIG. 1, in a semiconductor device according to this embodiment, a horizontal-type nitride semiconductor element composing a clamp diode 21 is provided. In this nitride semiconductor element, on a substrate (not shown), as a first semiconductor layer, an undoped $Al_xGa_{1-x}N$ ($0 \le x < 1$) such as a GaN layer 1 made of GaN is provided. Moreover, on the GaN layer 1, as a second semiconductor layer, an undoped or n-type $Al_yGa_{1-y}N$ ($0 < y \le 1$, $x < y$) such as an AlGaN layer 2 made of undoped AlGaN is provided.

Furthermore, in some region of the upper surface of the AlGaN layer 2, a p-barrier layer 3 is formed as a third semiconductor layer. The p-barrier layer 3 is a semiconductor region having a conductivity type of p-type, passes through the AlGaN layer 2 in the thickness direction and reaches the upper layer portion of the GaN layer 1. The p-barrier layer 3 can be formed by doping an impurity to be a p-type dopant such as fluorine or magnesium onto the upper surface of the AlGaN layer 2. The p-barrier layer 3 does not necessarily reach the GaN layer 1 but is sufficient at least when formed on the upper surface of the AlGaN layer 2 or when being in contact with the AlGaN layer 2.

Moreover, on the AlGaN layer 2, an anode electrode 4 and a cathode electrode 5 are provided so as to be separate from each other. In the vicinity of the interface of the GaN layer 1 and the AlGaN layer 2 (hereinafter, also referred to as AlGaN/GaN heterointerface), a two-dimensional electron gas (2DEG) is generated and the anode electrode 4 and the cathode electrode 5 are electrically connected to the 2DEG. Viewed from the direction perpendicular to the upper surface of the AlGaN layer 2 (hereinafter, referred to as "by plane view"), the p-barrier layer 3 is disposed in the region between the anode electrode 4 and the cathode electrode 5. The p-barrier layer 3 lies in a current pathway between the anode electrode 4 and the cathode electrode 5.

Next, operation of this embodiment will be described.

Between the anode electrode 4 and the cathode electrode 5 (hereinafter, also referred to as "between anode-cathode"), when normal operation voltage is applied (hereinafter, also referred to as "normal voltage application state"), the two-dimensional electron gas (2DEG) in the AlGaN/GaN heterointerface is depleted inside or near the p-barrier layer 3 by existence of the p-barrier layer 3. Therefore, as shown by the dashed line in FIG. 1, a potential barrier is formed in a position corresponding to the p-barrier layer 3 between anode-cathode, and a current does not flow. For depleting the 2DEG, a sheet impurity concentration of the p-barrier layer 3 is required to be higher than a sheet concentration of the 2DEG.

On the other hand, when a predetermined magnitude or more of surge voltage higher than normal voltage is applied between anode-cathode (hereinafter, also referred to as "high voltage application state"), the p-barrier layer 3 is depleted to lower the potential barrier due to the p-barrier layer 3 as shown by the solid line in FIG. 1, and thereby, the current becomes capable of flowing in the current pathway between the anode electrode 4 and the cathode electrode 5. That is, electrons come to pass through the inside of the p-barrier layer 3, and a leak current flows between anode-cathode. In this case, voltage between anode-cathode is clamped to be constant voltage. Thereby, it becomes possible to make the condition that a large current flows by large voltage, similarly to the case of occurrence of avalanche breakdown. The magnitude of the voltage in which the current starts to flow between anode-cathode, namely, the clamp voltage is determined by a length of the p-barrier layer 3 in the direction of current flowing and the impurity concentration in the p-barrier layer 3.

Next, the effect of this embodiment will be described.

As described above, in this embodiment, in a nitride semiconductor element having an AlGaN/GaN heterointerface, a diode structure is formed so that a leak current can flow between anode-cathode in the high voltage application state. Thereby, even if high voltage is extemporaneously applied by surge or the like, the current can be flowed while clamping voltage. As a result, the power due to the surge can be consumed in the element, similarly to the case of generating the avalanche breakdown, and the nitride semiconductor element can be functioned as a clamp diode of treating the surge voltage. Moreover, in this embodiment, because the surge current flows between the anode electrode 4 and the cathode electrode 5, magnitude of the current being capable of being flowed is not constrained by the contact resistivity of the p-barrier layer 3. Accordingly, the element can be sufficiently functioned as the clamp diode also in the nitride semiconductor element. As described above, according to this embodiment, a semiconductor device having high surge resistance can be realized.

First Modified Example of First Embodiment

Figure 2:
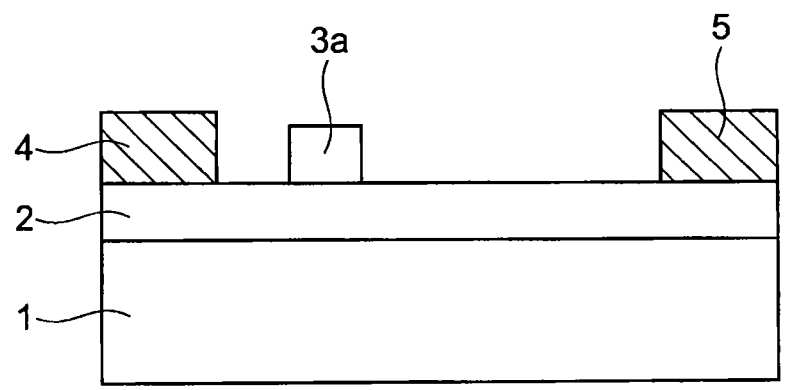
FIG. 2 is a cross-sectional view illustrating a semiconductor device according to a first modified example of the first embodiment.

FIG. 2 is a cross-sectional view illustrating a semiconductor device according to a first modified example of the first embodiment. The same numerals as FIG. 1 are appended to the same or corresponding constituent elements as the constituent elements shown in FIG. 1 out of the constituent elements shown in FIG. 2, and the description thereof will not be described in detail. This is the same in the other figures to be described layer.

As shown in FIG. 2, in the semiconductor device according to this modified example, the p-barrier layer 3 (see, FIG. 1) is not formed in the AlGaN layer 2, compared to the semiconductor device (see, FIG. 1) according to the above-described first embodiment. Instead, as the third semiconductor layer, a p-type GaN layer 3a is provided on the AlGaN layer 2. The p-type GaN layer 3a is formed selectively in a region between the anode electrode 4 and the cathode electrode 5 on the AlGaN layer 2 and is in contact with the AlGaN layer 2.

For obtaining the above-described effect as a clamp diode, in the normal voltage application state, the 2DEG can be depleted in the region between the anode electrode 4 and the cathode electrode 5 to generate the potential barrier. Therefore, the clamp diode can have the structure shown in FIG. 2. Also, in this case, in the high voltage application state, the p-barrier layer 3 can be depleted and the current flows between anode-cathode. The configuration, operation, and effect except for the above-described ones in this modified example are the same as the above-described first embodiment.

Second Modified Example of First Embodiment

Figure 3A:
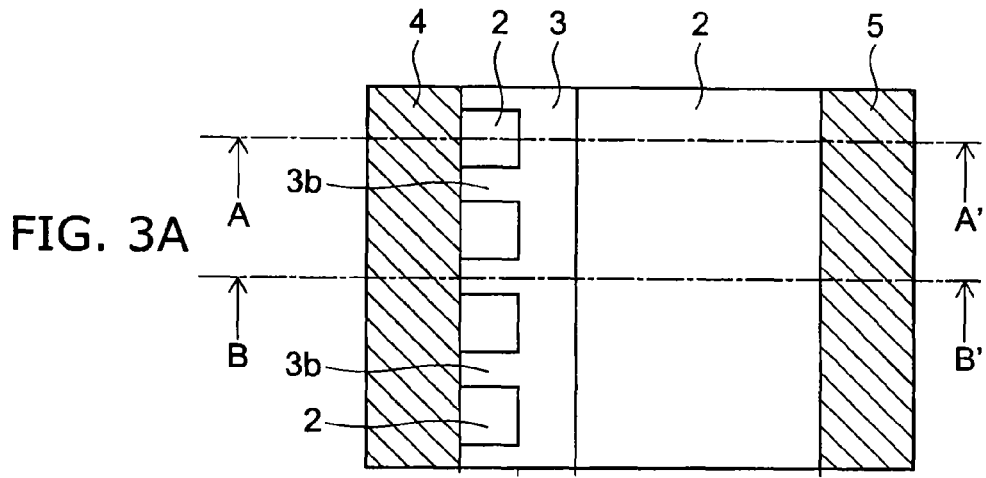
FIG. 3A is a plan view illustrating a semiconductor device according to a second modified example of the first embodiment.
Figure 3B:
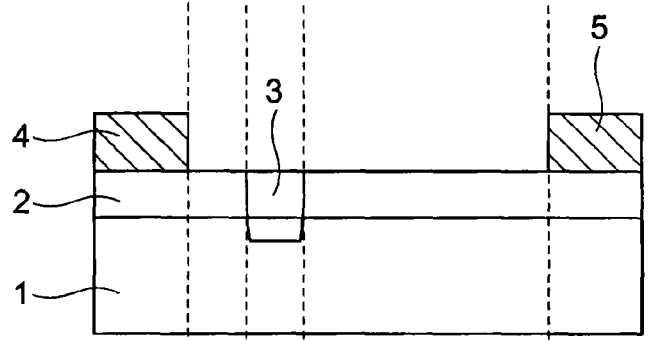
FIG. 3B is a cross-sectional view of A-A' line shown in FIG. 3A.
Figure 3C:
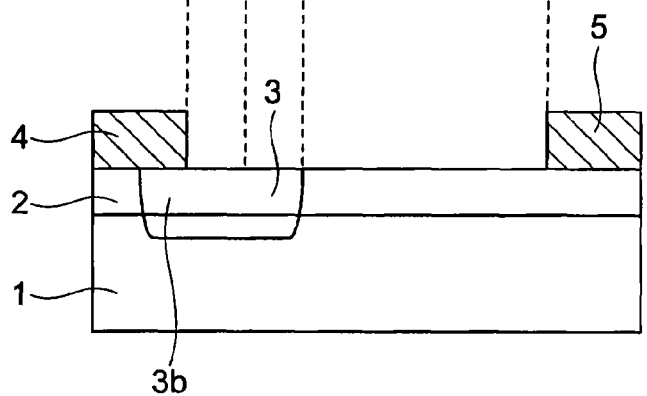
FIG. 3C is a cross-sectional view of B-B' line shown in FIG. 3A.

FIG. 3A is a plan view illustrating a semiconductor device according to a second modified example of the first embodiment, FIG. 3B is a cross-sectional view of A-A' line shown in FIG. 3A, and FIG. 3C is a cross-sectional view of B-B' line shown in FIG. 3A.

As shown in FIGS. 3A to 3C, in the semiconductor device according to this modified example, the shape of the p-barrier layer 3 is a comb shape by plane view, and the tops of the comb are in contact with the anode electrode 4. That is to say, in the p-barrier layer 3, a plurality of connecting portions 3b are periodically arranged along the direction orthogonal to the direction from the anode electrode 4 to the cathode electrode 5, and the connecting portions 3b are in contact with the anode electrode 4 to be electrically connected to the anode electrode 4.

As described above, in the high voltage application state, the p-barrier layer 3 is depleted to lower the potential barrier. In this case, electric charge and discharge of holes occur in the p-barrier layer 3 by applying high voltage. In this modified example, because the p-barrier layer 3 is directly connected to the anode electrode 4, the electric charge and discharge of holes can be promptly performed. The configuration, operation, and effect except for the above-described ones in this modified example are the same as the above-described first embodiment.

Third Modified Example of First Embodiment

Figures 4A, 4B, 4C:
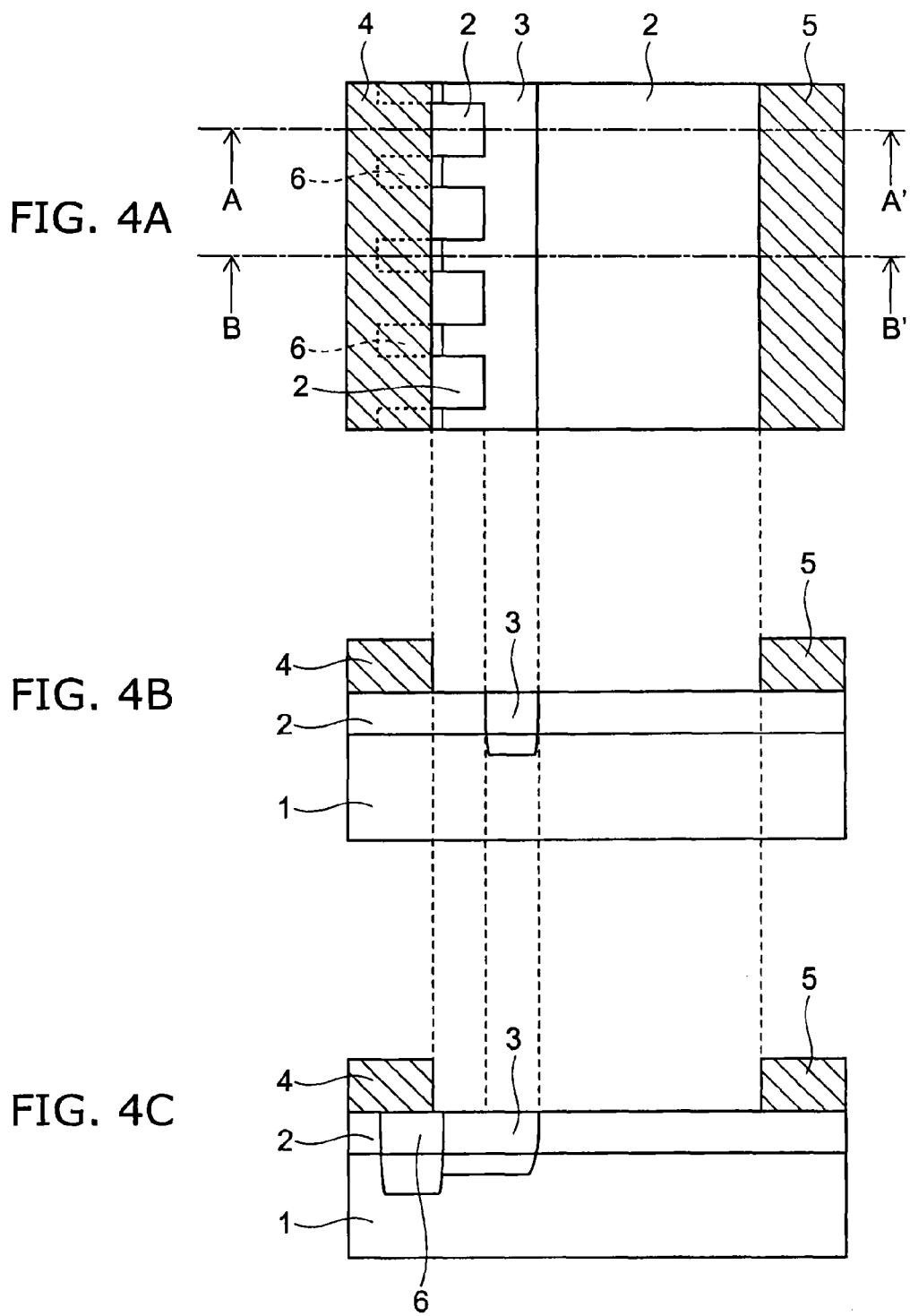
FIG. 4A is a plan view illustrating a semiconductor device according to a third modified example of the first embodiment.
FIG. 4B is a cross-sectional view of A-A' line shown in FIG. 4A.
FIG. 4C is a cross-sectional view of B-B' line shown in FIG. 4A.

FIG. 4A is a plan view illustrating a semiconductor device according to a third modified example of the first embodiment, FIG. 4B is a cross-sectional view of A-A' line shown in FIG. 4A, and FIG. 4C is a cross-sectional view of B-B' line shown in FIG. 4A.

As shown in FIGS. 4A to 4C, the semiconductor device according to this modified example is different from the above-described second modified example of the first embodiment in the point that a p$^+$ contact layer 6 is formed in the contact part of the p-barrier layer 3 with the anode electrode 4. The p$^+$ contact layer 6 has a conductivity type of p-type and is a region having a p-type impurity concentration higher than a p-type impurity concentration of the p-barrier layer 3.

According to this modified example, by forming the p$^+$ contact layer 6, the contact resistance between the p-barrier layer 3 and the anode electrode 4 can be reduced. Thereby, if avalanche breakdown occurs to generate a large number of holes, the holes can be promptly discharged to prevent the element from breaking down. The configuration, operation, and effect except for the above-described ones in this modified example are the same as the above-described second modified example of the first embodiment.

Second Embodiment

Figure 5:
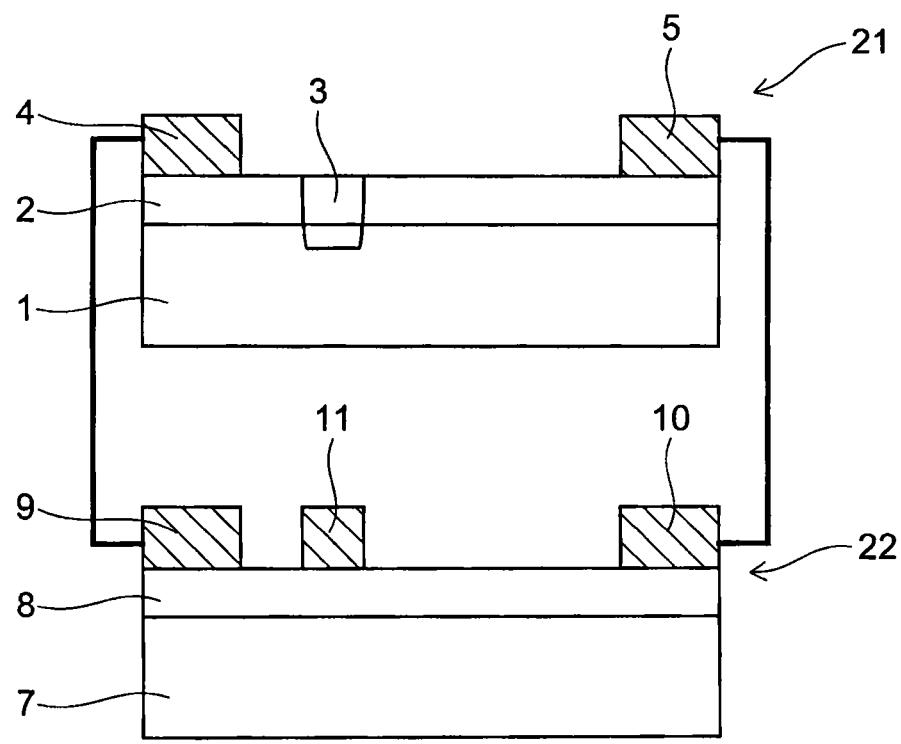
FIG. 5 is a cross-sectional view illustrating a semiconductor device according to a second embodiment of the invention.

FIG. 5 is a cross-sectional view schematically illustrating the configuration of a semiconductor device according to a second embodiment of the invention.

As shown in FIG. 5, in the semiconductor device according to this embodiment, a HFET (heterostructure field effect transistor) 22 is provided as well as the above-described clamp diode 21 shown in the first embodiment.

In the HFET 22, on a substrate (not shown), as a fourth semiconductor layer, an undoped $Al_zGa_{1-z}N$ ($0 \leq z < 1$) such as a GaN layer 7 made of GaN is provided. Moreover, on the GaN layer 7, as a fifth semiconductor layer, an undoped or n-type $Al_uGa_{1-u}N$ ($0 < u \leq 1$, $z < u$) such as an AlGaN layer 8 made of undoped AlGaN is provided. Furthermore, on the AlGaN layer 8, a source electrode 9 and a drain electrode 10 are provided so as to be separate from each other, and a gate electrode 11 is provided between the source electrode 9 and the drain electrode 10 on the AlGaN layer 8. The source electrode 9 and the drain electrode 10 are electrically connected to the 2 DEG occurring in the vicinity of the interface of the GaN layer 7 and the AlGaN layer 8 (AlGaN/GaN heterointerface). Moreover, the gate electrode 11 forms a Schottky contact with the AlGaN layer 8.

The anode electrode 4 of the clamp diode 21 is connected to the source electrode 9 of the HFET 22 through a wire. The cathode electrode 5 is connected to the drain electrode 10 through a wire. Thereby, the clamp diode 21 is connected in parallel between drain-source of the HFET 22.

According to this embodiment, even if the HFET 22 does not have surge resistance in itself, by connecting the clamp diode 21, the clamp diode 21 becomes conductive to flow a surge current when the surge is applied to the HFET 22, and the HFET 22 can be protected. In this case, compared to the case that the HFET 22 generates avalanche breakdown in itself to clamp the voltage, stable operation can be expected in such a case of clamping the clamp diode 21 as this embodiment.

That is, if the avalanche breakdown is caused in the HFET 22, electrons and holes are generated between the gate electrode 11 and the drain electrode 10. However, the generated holes are not promptly discharged from the gate electrode 11 and therefore the element is easily broken. Even if a p layer is formed in the source electrode 9 so that the holes are promptly discharged, some of the holes are injected into the Schottky contact between the gate electrode 11 and the AlGaN layer 8 to degrade the Schottky contact interface. Moreover, if a gate insulating film 12 (see, FIG. 6) is provided as shown in such a case as the first modified example to be described later, the holes are injected into the gate insulating film 12 to degrade reliability of the gate. By contrast, in this embodiment, the clamp diode 21 becomes conductive when the surge is applied thereto, and thereby, the HFET 22 does not generate the avalanche breakdown in itself. Therefore, reliability of the HFET 22 is not degraded and stable operation can be expected. The configuration, operation, and effect except for the above-described ones in this embodiment are the same as the above-described first embodiment.

First Modified Example of Second Embodiment

Figure 6:
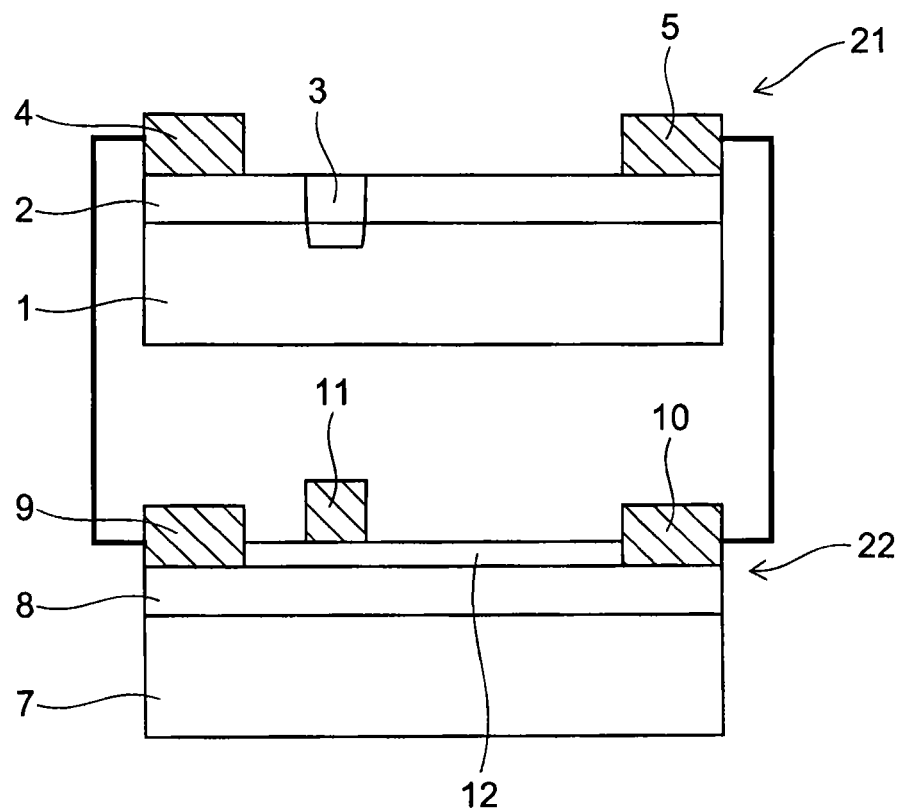
FIG. 6 is a cross-sectional view illustrating a semiconductor device according to a first modified example of the second embodiment.

FIG. 6 is a cross-sectional view schematically illustrating the configuration of a semiconductor device according to a first modified example of the second embodiment.

As shown in FIG. 6, in the semiconductor device according to this embodiment, compared to the above-described semiconductor device according to the second embodiment (see, FIG. 5), a gate insulating film 12 is formed between the AlGaN layer 8 and the gate electrode 11 in the HFET 22. Thereby, the HFET 22 serves as an insulating gate type element. As a result, a gate leak current in the HFET 22 can be reduced. In this modified example, by connecting the clamp diode 21 to the HFET 22 in parallel, avalanche breakdown comes not to occur. Therefore, it becomes needless to form a Schottky contact or a p-n junction as the pathway for flowing the holes generated by the avalanche breakdown, and the structure can be an insulating gate structure. The configuration, operation, and effect except for the above-described ones in this modified example are the same as the above-described second embodiment.

Second Modified Example of Second Embodiment

Figure 7:
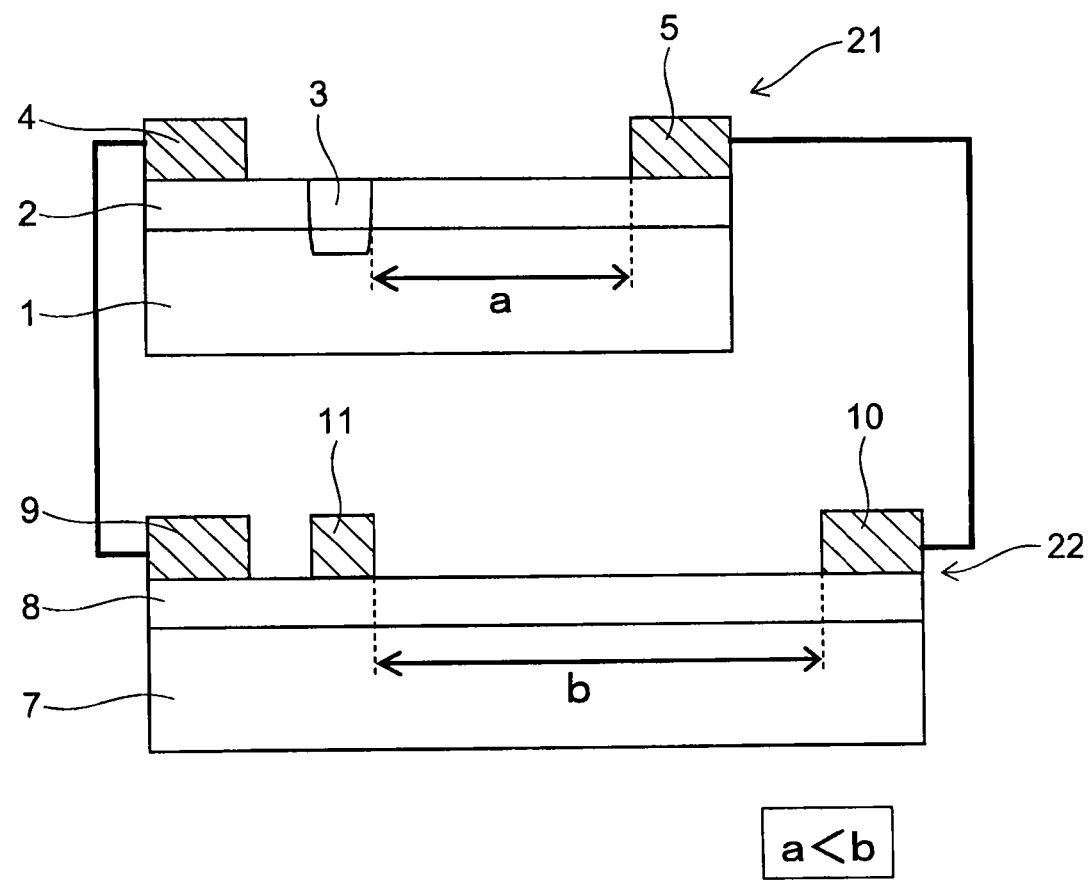
FIG. 7 is a cross-sectional view illustrating a semiconductor device according to a second modified example of the second embodiment.

FIG. 7 is a cross-sectional view schematically illustrating the configuration of a semiconductor device according to a second modified example of the second embodiment.

As shown in FIG. 7, in the semiconductor device according to this modified example, a distance a between the p-barrier layer 3 and the cathode electrode 5 in the clamp diode 21 is shorter than a distance b between the gate electrode 11 and the drain electrode 10 in the HFET 22. Thereby, the clamp voltage of the clamp diode 21, namely, voltage in which a current starts to flow, can be certainly made to be lower than the breakdown voltage of the HFET 22. As a result, before the HFET 22 is broken, the current can be certainly flowed through the clamp diode 21. The configuration, operation, and effect except for the above-described ones in this modified example are the same as the above-described first modified example of the second embodiment.

Third Modified Example of Second Embodiment

Figure 8:
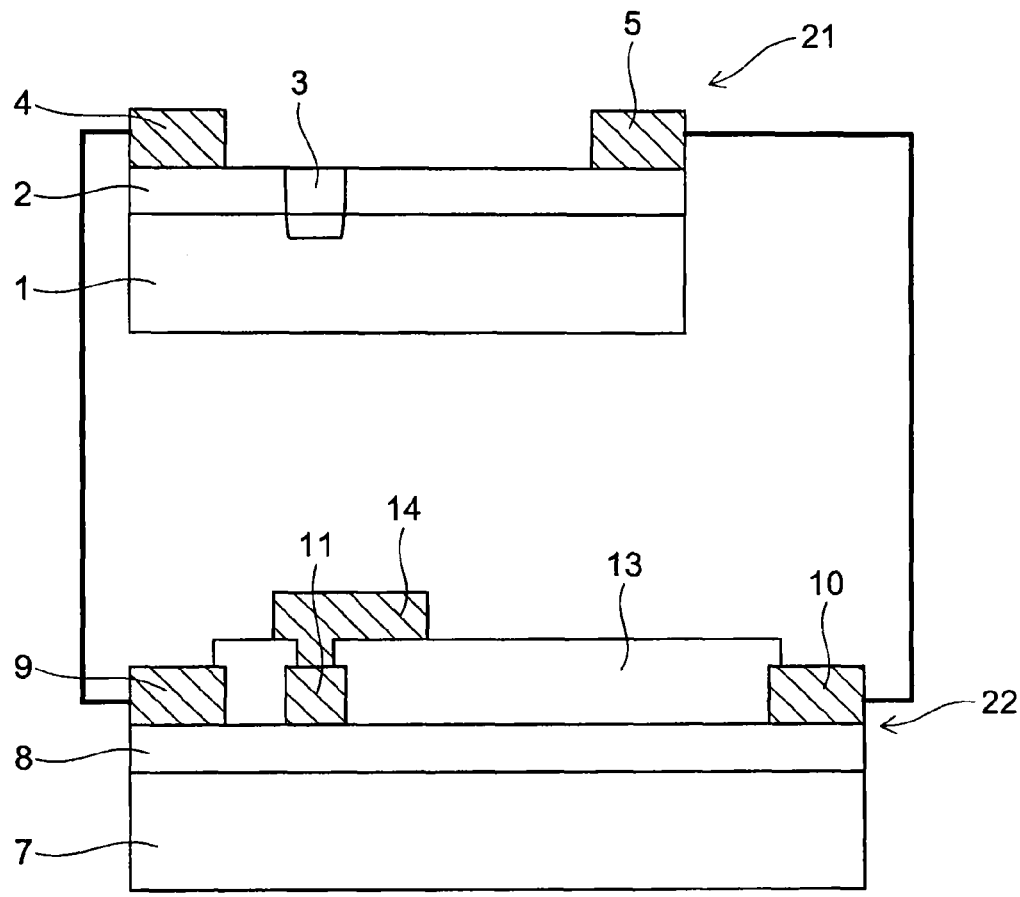
FIG. 8 is a cross-sectional view illustrating a semiconductor device according to a third modified example of the second embodiment.

FIG. 8 is a cross-sectional view schematically illustrating the configuration of a semiconductor device according to a third modified example of the second embodiment.

As shown in FIG. 8, in the semiconductor device according to this modified example, in addition of the above-described structure of the semiconductor device (FIG. 7) according to the second modified example of the second embodiment, in the HFET 22, a field insulating film 13 is provided on the AlGaN layer 8 and a gate field plate (FP) electrode 14 connected to the gate electrode 11 is provided on the field insulating film 13. The gate FP electrode 14 extends from an immediately upper region of the gate electrode 11 to an immediately upper region of the drain electrode 10 but is not connected to the drain electrode 10. According to this modified example, by providing the gate FP electrode 14, concentration of electric field in the end of the gate electrode 11 is suppressed to be capable of improving the breakdown voltage of the HFET 22. The configuration, operation, and effect except for the above-described ones in this modified example are the same as the above-described second example of the second embodiment.

Fourth Modified Example of Second Embodiment

Figure 9:
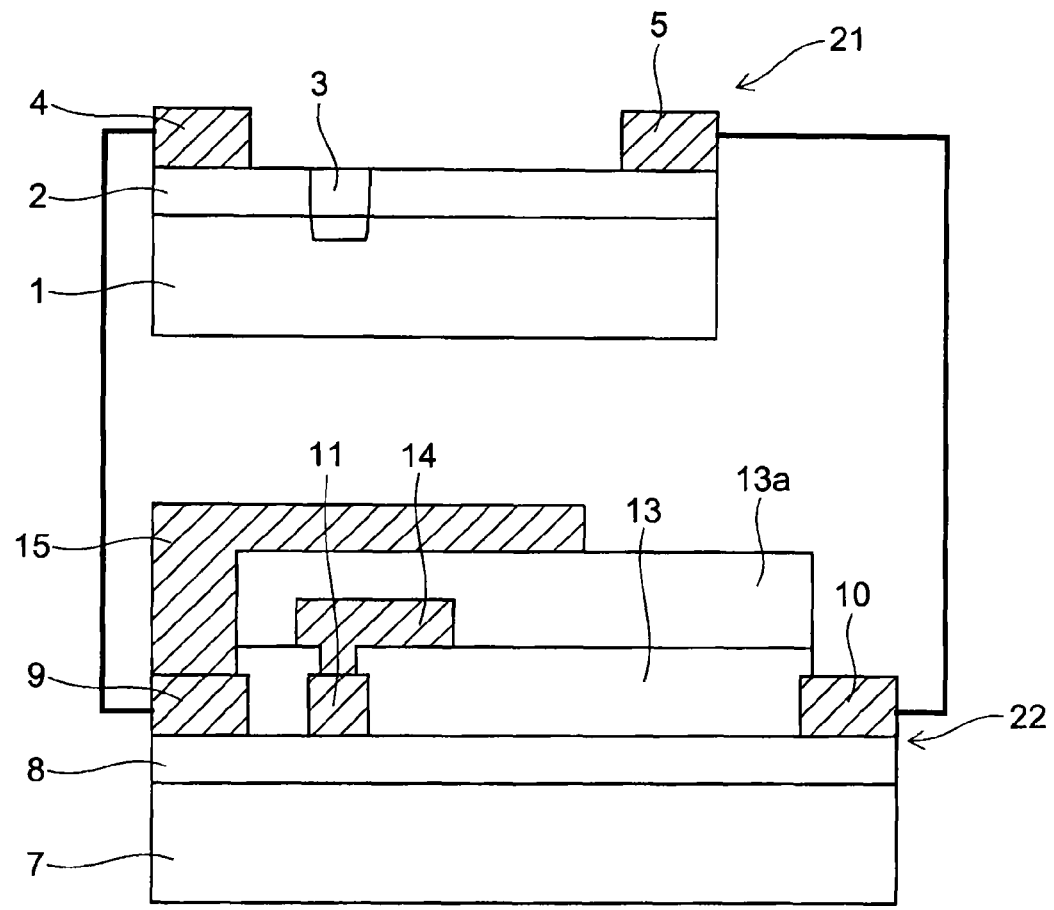
FIG. 9 is a cross-sectional view illustrating a semiconductor device according to a fourth modified example of the second embodiment.

FIG. 9 is a cross-sectional view schematically illustrating the configuration of a semiconductor device according to a fourth modified example of the second embodiment.

As shown in FIG. 9, in the semiconductor device according to this modified example, in addition of the above-described structure of the semiconductor device (FIG. 8) according to the third modified example of the second embodiment, in the HFET 22, a field insulating film 13a is provided so as to cover the gate FP electrode 14 on the field insulating film 13, and a source field plate (FP) electrode 15 connected to the source electrode 9 is provided on the field insulating film 13a. The source FP electrode 15 extends from an immediately upper region of the source electrode 9 over an immediately upper region of the gate electrode 11 to an immediately upper region of the drain electrode 10. Moreover, the source FP electrode 15 is insulated from the gate FP electrode 14 by the field insulating film 13a. According to this modified example, by providing the source FP electrode 15 in addition of the gate FP electrode 14, the concentration of electric field in the end of the gate electrode 11 can be effectively suppressed to be capable of more improving the breakdown voltage of the HFET 22. The configuration, operation, and effect except for the above-described ones in this modified example are the same as the above-described third modified example of the second embodiment.

Fifth Modified Example of Second Embodiment

Figure 10:
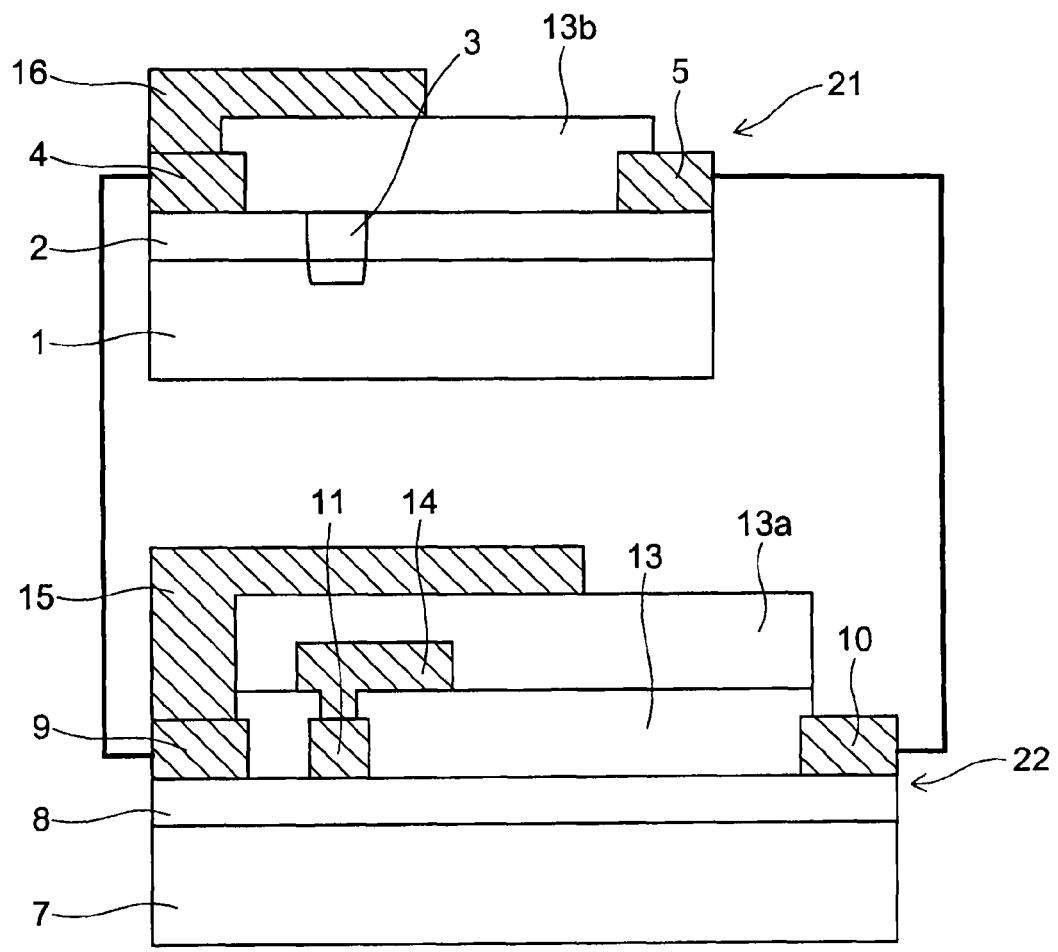
FIG. 10 is a cross-sectional view illustrating a semiconductor device according to a fifth modified example of the second embodiment.

FIG. 10 is a cross-sectional view schematically illustrating the configuration of a semiconductor device according to a fifth modified example of the second embodiment.

As shown in FIG. 10, in the semiconductor device according to this modified example, in addition of the above-described structure of the semiconductor device (FIG. 9) according to the fourth modified example of the second embodiment, in the clamp diode 21, a field insulating film 13b is provided on the AlGaN layer 2, and an anode field plate (FP) electrode 16 connected to the anode electrode 4 is provided on the field insulating film 13b. The anode FP electrode 16 extends from an immediately upper region of the anode electrode 4 over an immediately upper region of the p-barrier layer 3 to an immediately upper region of the cathode electrode 5, but is not connected to the cathode electrode 5.

According to this modified example, by providing the anode FP electrode 16, the clamp voltage of the clamp diode 21 can be controlled. That is, when a length of the anode FP electrode 16 is lengthened in the current direction, the electric field applied to the p-barrier layer 3 is lowered and the potential of the p-barrier layer 3 becomes difficult to lower. As a result, the clamp voltage increases. On the other hand, as the field insulating film 13b is thicker, a distance between the p-barrier layer 3 and the anode FP electrode 16 is larger. As a result, the electric field applied to the p-barrier layer 3 becomes difficult to be relaxed, and the clamp voltage lowers. As described above, according to this modified example, the clamp voltage can be regulated not only by concentration and the length of the p-barrier layer 3 but also by the length of the anode FP electrode 16 and thickness of the field insulating film 13. The configuration, operation, and effect except for the above-described ones in this modified example are the same as the above-described fourth modified example of the second embodiment.

Third Embodiment

Figure 11:
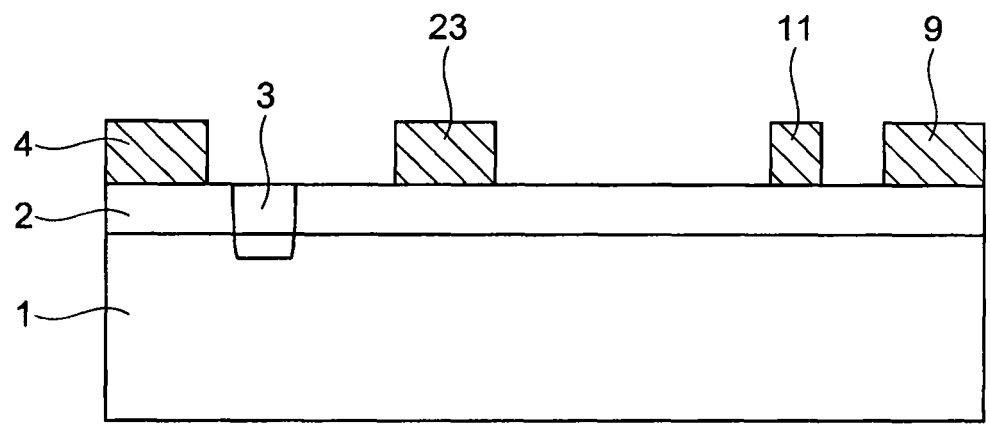
FIG. 11 is a cross-sectional view illustrating a semiconductor device according to a third embodiment of the invention.

FIG. 11 is a cross-sectional view schematically illustrating the configuration of a semiconductor device according to a third embodiment of this invention.

As shown in FIG. 11, the semiconductor device according to this embodiment is different from the above-described second embodiment (see, FIG. 5) in the point that the clamp diode and the HFET are formed on the same substrate. That is, on a single substrate (not shown), the GaN layer 1 and the AlGaN layer 2 are formed. On the AlGaN layer 2, the anode electrode 4, a common electrode 23, the gate electrode 11, and the source electrode 9 are provided so as to be arranged in this order. The common electrode 23 is an electrode having both functions of the cathode electrode 5 and the drain electrode 10 in the second embodiment. The p-barrier layer 3 is formed in a region of the GaN layer 1 and the AlGaN layer 2 between the anode electrode 4 and the common electrode 23.

Thereby, in this embodiment, the semiconductor device including the clamp diode and the HFET is formed as a single chip. That is, the clamp diode is composed by the GaN layer 1, the AlGaN layer 2, the anode electrode 4, the common electrode 23, and the p-barrier layer 3. The HFET is composed by the GaN layer 1, the AlGaN layer 2, the source electrode 9, and the common electrode 23, and the gate electrode 11. Also, in this embodiment, similarly to the above-described second modified example of the second embodiment (see, FIG. 7), by plane view, a distance between p-barrier layer 3 and the common electrode 23 is shorter than a distance between the gate electrode 11 and the common electrode 23.

As described above, because the identical heterostructure is used for both of the clamp diode and the HFET, they can be formed on the identical substrate in such a case as this embodiment. The cathode electrode and the drain electrode can be integrally formed. Moreover, because both of the anode electrode 4 and the source electrode 9 are electrically connected to the 2DEG, they can be formed at the same time.

Figure 12:
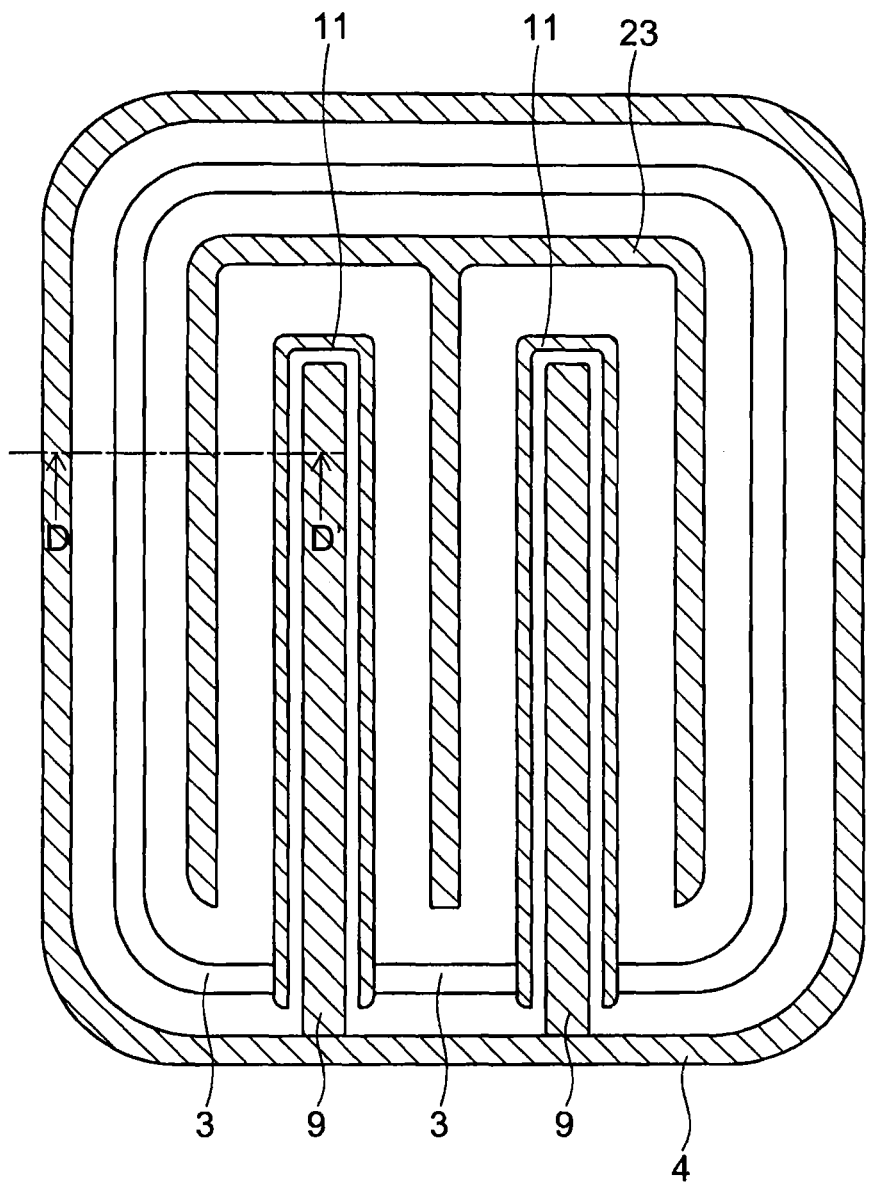
FIG. 12 is a plan view illustrating a semiconductor device according to this embodiment.

FIG. 12 is a plan view schematically illustrating the configuration of a semiconductor device according to this embodiment.

FIG. 11 corresponds to the cross-sectional view of D-D' line shown in FIG. 12. Moreover, the planar structure shown in FIG. 12 is one example of this embodiment, and the planar structure of this embodiment is not limited to the structure shown in FIG. 12.

As shown in FIG. 12, the semiconductor device according to this embodiment is formed as a single chip. By plane view, for example, two stripe-shaped source electrodes 9 are formed in parallel to each other in the central portion of the chip, and two U-shaped gate electrodes 11 are provided so as to surround three sides of each of the source electrodes 9. Moreover, the E-shaped common electrode 23 is disposed between the two gate electrodes 11 and in the both sides thereof and is provided so as to surround three sides of each of the gate electrodes 11. Furthermore, in the periphery of the chip, the frame-shaped anode electrode 4 is provided. The anode electrode 4 is connected to each one end of the source electrodes 9. Moreover, the p-barrier layer 3 is formed in a frame shape between the anode electrode 4 and the common electrode 23.

In general, the element area of the clamp diode and the element area of the HFET may not be equal. Generally, magnitude of a current flowed by the clamp diode in the high voltage application state is smaller than magnitude of an ON current flowed by the HFET in the normal voltage application state, and therefore, it is preferable that the element area of the clamp diode is smaller than the element area of the HFET. According to this embodiment, when the clamp diode and the HFET are integrated on the same substrate, the clamp diode can be disposed on the periphery of the chip composing the semiconductor device, and the HFET can be disposed in the central portion of the chip and thereby the ratio of the element areas can be appropriate.

The semiconductor devices shown in FIGS. 11 and 12 are set in an ON state or in an OFF state between the source electrode 9 and the common electrode 23 according to voltage of the gate electrode 11 in general use, and thereby, can function as the HFET. On the other hand, when the surge is applied between the anode electrode 4 and the common electrode 23, the p-barrier layer 3 is depleted to lower the potential. Thereby, 2DEG comes to flow in the p-barrier layer 3, and the current flows between the anode electrode 4 and the common electrode 23 to consume the surge power. Thereby, high surge resistance can be obtained.

According to this embodiment, the clamp diode and the HFET can be formed in a series of processes, and therefore, the number of process steps can be reduced, compared to the case of forming the clamp diode and the HFET independently to each other. Moreover, because the clamp diode and the HFET are integrally formed as the single chip, use efficiency of the wafer is high and assembling thereof is simple. The configuration, operation, and effect except for the above-described ones in this embodiment are the same as the above-described second embodiment.

Fourth Embodiment

Figure 13:
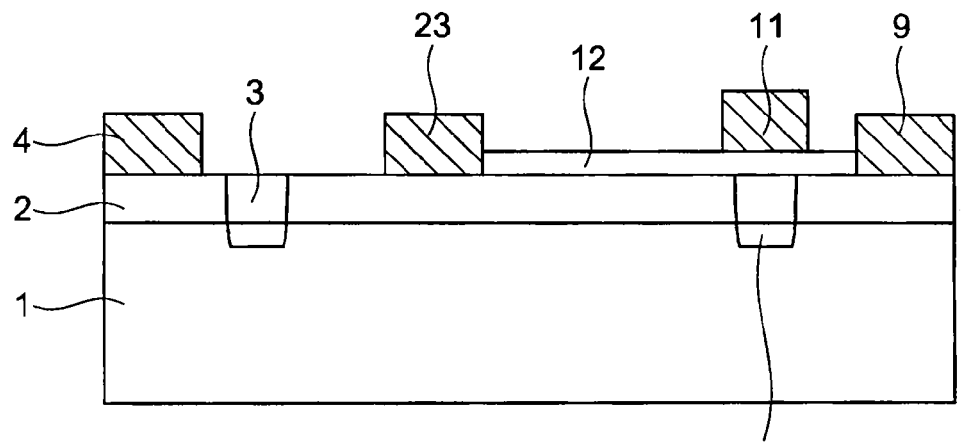
FIG. 13 is a cross-sectional view illustrating a semiconductor device according to a fourth embodiment of the invention.

FIG. 13 is a cross-sectional view schematically illustrating the configuration of a semiconductor device according to a fourth embodiment of this invention.

As shown in FIG. 13, in the semiconductor device according to this embodiment, in addition of the above-described configuration of the semiconductor device (see FIG. 11) according to the third embodiment, a gate insulating film 12 is provided between the gate electrode 11 and the AlGaN layer 2 of the HFET, and a p-type p-layer 17 is selectively formed in an upper layer portion of the GaN layer 1 and directly below the gate electrode 11. An impurity concentration of the p-layer 17 is higher than the impurity concentration of the p-barrier layer 3.

According to this embodiment, by providing the gate insulating film 12, a gate leak current of the HFET can be reduced. Moreover, because the p-layer 17 is formed directly below the gate electrode 11, even when the gate voltage applied to the gate electrode 11 is zero, the 2DEG channel is depleted to be capable of realizing normally-off operation. Furthermore, the impurity concentration of the p-layer 17 is higher than the impurity concentration of the p-barrier layer 3, and therefore, in the high voltage application state, the clamp diode becomes ON but the HFET does not become ON. Thereby, the HFET can be more certainly protected. The configuration, operation, and effect except for the above-described ones in this embodiment are the same as the above-described third embodiment.

Modified Example of Fourth Embodiment

Figure 14:
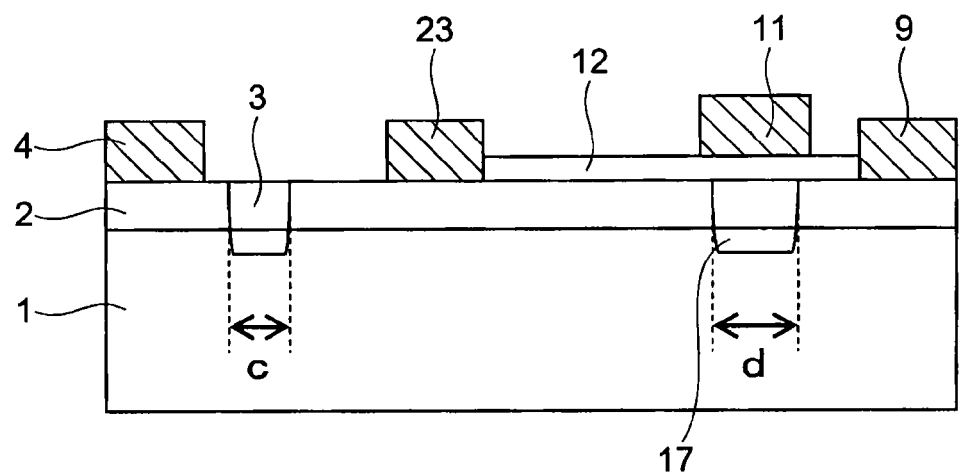
FIG. 14 is a cross-sectional view illustrating a semiconductor device according to a modified example of the fourth embodiment.

FIG. 14 is a cross-sectional view schematically illustrating the configuration of a semiconductor device according to a modified example of the fourth embodiment.

As shown in FIG. 14, the semiconductor device according to this modified example is different from the semiconductor device (FIG. 13) according to the above-described fourth embodiment in the points that the impurity concentrations of the p-barrier layer 3 and the p-layer 17 are equal to each other and that a length c of the p-barrier layer 3 in the direction from the anode electrode 4 to the common electrode 23 is shorter than a length d of the p-layer 17 (channel length) in the direction from the common electrode 23 to the source electrode 9.

The p-barrier layer 3 of the clamp diode has to be depleted in the high voltage application state, and therefore, it is desirable that the length c is relatively short. On the other hand, it is desirable that the p-layer 17 of the HFET is not depleted even in the high voltage application state, and therefore, it is desirable that the length d is relatively long. Accordingly, c<d is preferable as shown in FIG. 14. As described above, by selecting the relation of the sizes of the p-barrier layer 3 and the p-layer 17, the impurity concentrations of the p-barrier layer 3 and the p-layer 17 can be equal to each other to become capable of forming the p-barrier layer 3 and the p-layer 17 at the same time. Also, in this case, as shown in FIG. 7, by plane view, it is preferable that a distance between the p-barrier layer 3 and the common electrode 23 can be shorter than a distance between the common electrode 23 and the p-layer 17. The configuration, operation, and effect except for the above-described ones in this modified example are the same as the above-described fourth embodiment.

Fifth Embodiment

Figure 15:
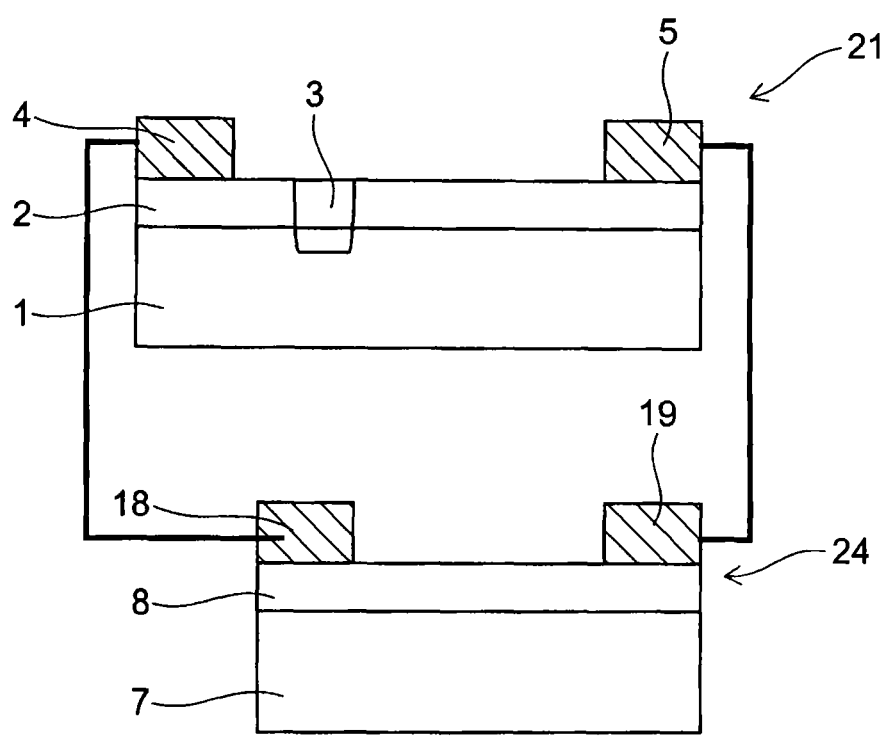
FIG. 15 is a cross-sectional view illustrating a semiconductor device according to a fifth embodiment of the invention.

FIG. 15 is a cross-sectional view schematically illustrating the configuration of a semiconductor device according to a fifth embodiment of this invention.

As shown in FIG. 15, the semiconductor device according to this embodiment is different from the semiconductor device (FIG. 5) according to the above-described second embodiment in the point that a HSBD (heterostructure Schottky barrier diode) 24 is provided instead of the HFET 22. That is, in the semiconductor device according to this embodiment, the clamp diode 21 and the HSBD 24 are connected in parallel.

In the HSBD 24, on a substrate (not shown), the GaN layer 7 and the AlGaN layer 8 are stacked. On the AlGaN layer 8, a Schottky electrode 18 and an ohmic electrode 19 are provided so as to be separate to each other. The Schottky electrode 18 is subjected to connection of Schottky junction to the AlGaN layer 8. Moreover, the ohmic electrode 19 is electrically connected to the 2DEG generated in the vicinity of the interface of the GaN layer 7 and the AlGaN layer 8 (AlGaN/GaN heterointerface). The anode electrode 4 of the clamp diode 21 is connected to the Schottky electrode 18 through a wire, and the cathode electrode 5 is connected to the ohmic electrode 19 through a wire.

According to this embodiment, even if avalanche breakdown does not occur in the HSBD 24 in the high voltage application state, a current flows in the clamp diode 21 with high voltage and the surge power is consumed, and therefore, the state in which the voltage is clamped can be realized. Thereby, a hole current does not flow in the Schottky contact of the HSBD 24, and the Schottky contact is not degraded. The configuration, operation, and effect except for the above-described ones in this embodiment are the same as the above-described second embodiment.

Modified Example of Fifth Embodiment

Figure 16:
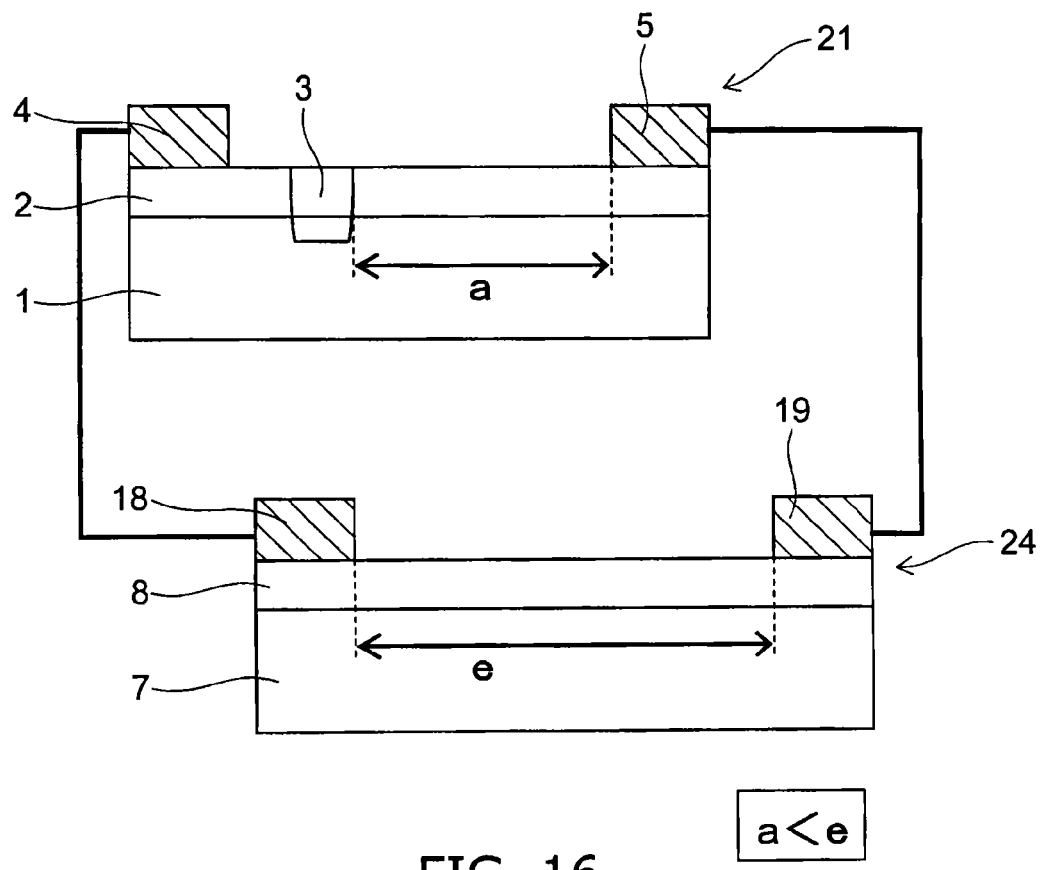
FIG. 16 is a cross-sectional view illustrating a semiconductor device according to a modified example of the fifth embodiment.

FIG. 16 is a cross-sectional view schematically illustrating the configuration of a semiconductor device according to a modified example of the fifth embodiment.

As shown in FIG. 16, in the semiconductor device according to this modified example, compared to the above-described semiconductor device according to the fifth embodiment (FIG. 15), a distance e between the Schottky electrode 18 and the ohmic electrode 19 in the HSBD 24 is longer than a distance a between the p-barrier layer 3 and the cathode electrode 5 in the clamp diode 21. Thereby, the breakdown voltage of the HSBD 24 can be higher than the clamp voltage of the clamp diode 21, and avalanche breakdown can be certainly prevented from occurring in the HSBD 24. The configuration, operation, and effect except for the above-described ones in this modified example are the same as the above-described fifth embodiment.

Sixth Embodiment

Figure 17:
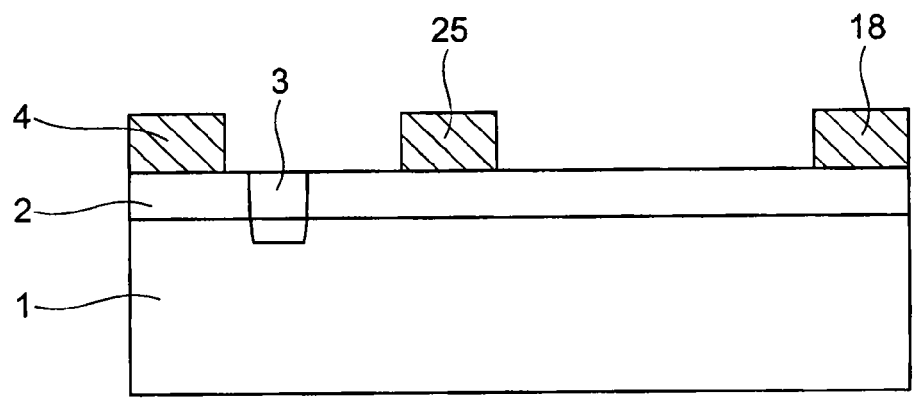
FIG. 17 is a cross-sectional view illustrating a semiconductor device according to a sixth embodiment of the invention.

FIG. 17 is a cross-sectional view schematically illustrating the configuration of a semiconductor device according to a sixth embodiment of the invention.

As shown in FIG. 17, the semiconductor device according to this embodiment is different from the above-described semiconductor device according to the fifth embodiment (see, FIG. 15 in the point that the clamp diode and the HSBD are formed on the same substrate. That is, the GaN layer 1 and the AlGaN layer 2 are formed on the same substrate (not shown). The anode electrode 4, a common electrode 25, and the Schottky electrode 18 are provided on the AlGaN layer 2 so as to be arranged to in this order. The common electrode 25 is an electrode having both functions of the cathode electrode 5 and the ohmic electrode 19 in the fifth embodiment. The p-barrier layer 3 is formed in the region of the GaN layer 1 and the AlGaN layer 2 between the anode electrode 4 and the common electrode 25. Thereby, the GaN layer 1, the AlGaN layer 2, the anode electrode 4, the common electrode 25, and the p-barrier layer 3 compose the clamp diode. And, the GaN layer 1, the AlGaN layer 2, Schottky electrode 18, and the common electrode 25 compose the HSBD.

As described above, because the same heterostructure is used, the clamp diode and the HSBD can be formed on the same substrate. The cathode electrode and the drain electrode can be formed integrally. Moreover, both of the anode electrode and the ohmic electrode are electrically connected to the 2DEG and therefore can be formed at the same time.

Seventh Embodiment

Figure 18A:
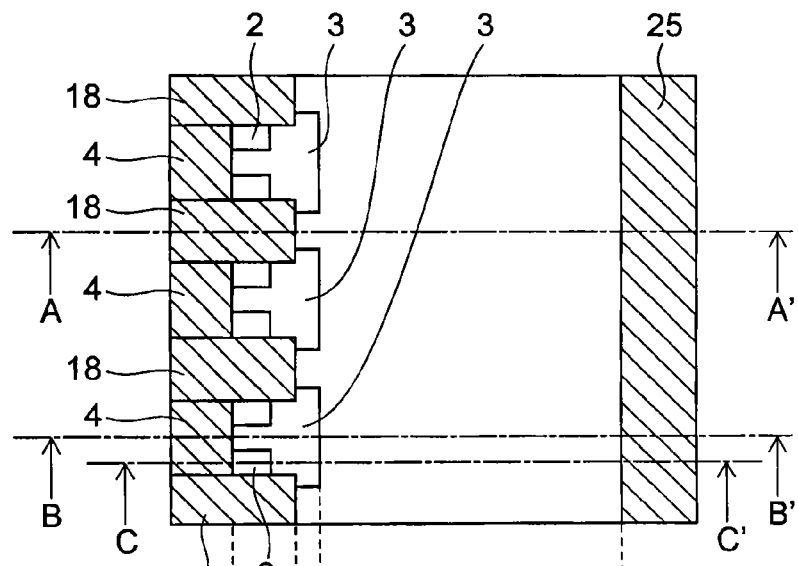
FIG. 18A is a plan view illustrating a semiconductor device according to a seventh embodiment of the invention.
Figure 18B:
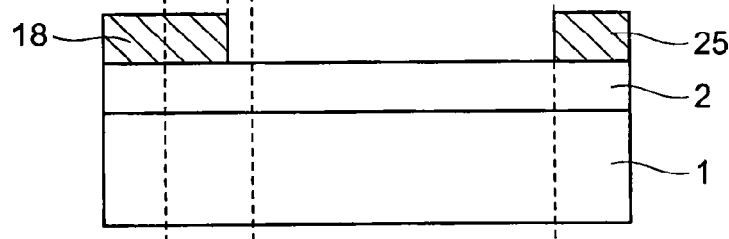
FIG. 18B is a cross-sectional view of A-A' line shown in FIG. 18A.
Figure 18C:
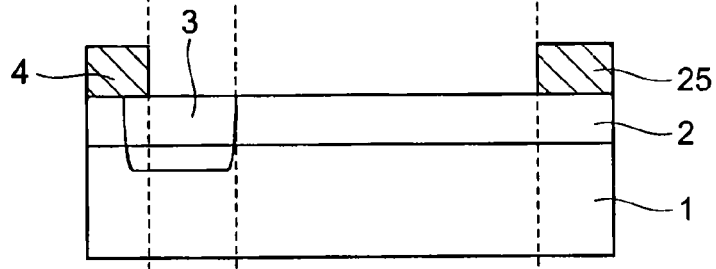
FIG. 18C is a cross-sectional view of B-B' line shown in FIG. 18A.
Figure 18D:
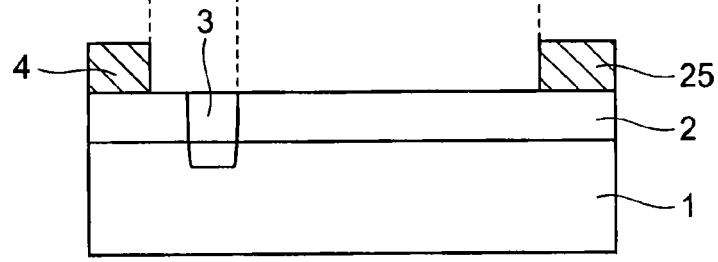
FIG. 18D is a cross-sectional view of C-C' line shown in FIG. 18A.

FIG. 18A is a plan view illustrating a semiconductor device according to a seventh embodiment of this invention, FIG. 18B is a cross-sectional view of A-A' line shown in FIG. 18A, FIG. 18C is a cross-sectional view of B-B' line shown in FIG. 18A, and FIG. 18D is a cross-sectional view of C-C' line shown in FIG. 18A.

As shown in FIGS. 18A-18D, in the semiconductor device according to this embodiment, by plane view, the anode electrodes 4 and the Schottky electrodes 18 are alternatively and periodically arranged, and the striped-shaped common electrode 25 is provided in parallel to a line composed of the anode electrodes 4 and the Schottky electrodes 18. Thereby, the clamp diodes and the HSBDs are periodically formed. And, in an upper layer portion of the GaN layer 1 and in a region of the AlGaN layer 2 extending from an immediately lower region of the anode electrode 4 to the common electrode 25, the p-barrier layer 3 is formed. An end of the p-barrier layer 3 in the side of the common electrode 25 protrudes in the side of the common electrode 25 more than the Schottky electrode 18 but is not in contact with the common electrode 25. Moreover, the p-barrier layer 3 extends to both sides in the end of the side of the common electrode 25 and totally forms a T shape.

In this embodiment, because the p-barrier layer 3 is directly connected to the anode electrode 4, electrical charge or discharge of holes to the p-barrier layer 3 can be rapidly performed. Moreover, a distance between the Schottky electrode 18 and the common electrode 25 is longer than a distance between the p-barrier layer 3 and the common electrode 25, and therefore, voltage is not applied too much to the Schottky contact between the Schottky electrode 18 and the AlGaN layer 2 even in the high voltage application state, and a leak current of the Schottky contact is not increased. The configuration, operation, and effect except for the above-described ones in this embodiment are the same as the above-described sixth embodiment.

Eighth Embodiment

Figure 19:
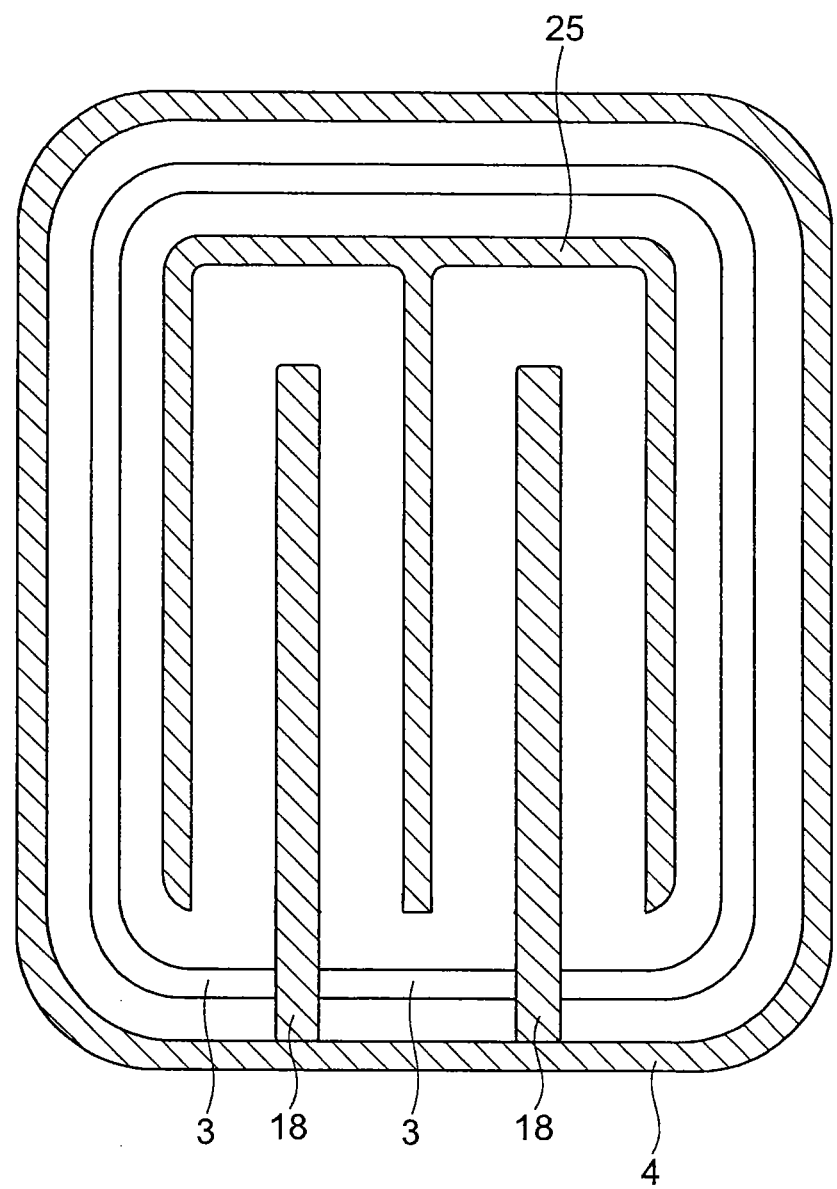
FIG. 19 is a plan view illustrating a semiconductor device according to an eighth embodiment of the invention.

FIG. 19 is a plan view illustrating a semiconductor device according to an eighth embodiment of this invention.

As shown in FIG. 19, the semiconductor device according to this embodiment is formed as a single chip. By plane view, in a central portion of the chip, for example, two stripe-shaped Schottky electrodes 18 are provided in parallel to each other. Moreover, the E-shaped common electrode 25 is disposed between the two Schottky electrodes 18 and in both sides thereof and is provided so as to surround the three sides of the Schottky electrodes 18. Furthermore, in the periphery of the semiconductor device, a frame-shaped anode electrode 4 is provided. The anode electrode 4 is connected to one end of each of the Schottky electrodes 18. Moreover, the p-barrier layer 3 is formed in a frame shape between the anode electrode 4 and the common electrode 25.

A reverse current flowing through the clamp diode is smaller than a forward current flowing through the HSBD, and therefore, it is desirable that an element area of the clamp diode is smaller than an area of the HSBD. According to this embodiment, the semiconductor device is composed as the single chip, and the clamp diode is arranged in the periphery of this chip and the HSBD is arranged in the central portion of the chip, and thereby, the area of each of the elements can be appropriately set. The configuration, operation, and effect except for the above-described ones in this embodiment are the same as the above-described sixth embodiment.

As described above, this invention has been described by the first to eighth embodiments and the modified examples thereof. However, this invention is not limited to the embodiments and the modified examples. All of the modifications that can be thought by a skilled person in the art are applicable. That is, the above-described respective embodiments or the modified examples thereof to which addition, deletion, or design change of a constituent element is subjected appropriately by a skilled person are included in the scope of this invention as long as having the essentials of this invention.

Moreover, the above-described respective embodiments or the modified examples thereof can be carried out in combination of one another.

For example, the first conductivity type may be n-type and the second conductivity type may be p-type. Alternatively, the first conductivity type may be p-type and the second conductivity type may be n-type.

Moreover, this invention is not limited by material of the support substrate for forming the GaN layer 1 and the AlGaN layer 2, but a SiC substrate, a sapphire substrate, a Si substrate, a GaN substrate, or the like can be used for the support substrate. Moreover, a buffer layer may be provided between the support substrate and the GaN layer 1. The structure and the material of this buffer layer are also not particularly limited. For example, a stacked structure in which an AlN layer, an AlGaN layer, or an AlN layer and a GaN layer are stacked can be crystallized and grown.

Moreover, in each of the above-described embodiments and the modified examples, the example in which the GaN layer 1 is formed by undoped GaN is shown. However, the GaN layer 1 may be formed by undoped AlGaN. Moreover, in each of the above-described embodiments and the modified examples, the example in which the AlGaN layer 2 is formed by undoped AlGaN is shown. However, the AlGaN layer 2 may be formed by AlGaN doped to be n-type. Also, the AlGaN layer 2 may be formed by AlN. That is, in each of the above-described embodiments and the modified examples, the example in which an AlN/AlGaN heterostructure is formed is shown. This invention is not limited thereto, and a heterostructure in which of the composition ratio of Al and Ga in each layer is discretionarily set such as an AlN/AlGaN heterostructure may be formed.

Furthermore, in each of the above-described embodiments and the modified examples, the example in which the gate portion has a planer Schottky gate structure is shown. However, this invention is not limited thereto, and another gate structure such as, a recessed-gate structure or a structure in which a GaN cap layer is formed, can also be carried out. Moreover, in the above-described fourth embodiment, the example in which the p-layer 17 is formed for making the HFET normally-off (see, FIG. 13) is shown. However, as shown in the first modified example of the first embodiment, the p-type GaN layer 3a or a p-type AlGaN layer may be formed on the AlGaN layer 2 to deplete the 2DEG to realize the normally OFF.

The invention claimed is:

1. A semiconductor device comprising:
  a first semiconductor layer made of $Al_xGa_{1-x}N$ ($0 \leq x < 1$);
  a second semiconductor layer provided on the first semiconductor layer and made of undoped or first conductivity type $Al_yGa_{1-y}N$ ($0 < y \leq 1$, $x < y$);
  an anode electrode and a cathode electrode, the anode electrode having a first surface which is provided directly on the second semiconductor layer, the cathode electrode having a second surface which is provided directly on the second semiconductor layer, and the second semiconductor layer including first contact parts which are directly in contact with the anode electrode; and
  a third semiconductor layer of a second conductivity type provided between the anode electrode and the cathode electrode, the third semiconductor layer passing through the second semiconductor layer and reaching the first semiconductor layer, the third semiconductor layer including second contact parts which are directly in contact with the anode electrode, and the first contact part and the second contact part being alternately arranged along a direction which is orthogonal to a direction from the anode electrode to the cathode electrode and a direction from the first semiconductor layer to the second semiconductor layer.

2. The semiconductor device according to claim 1, further comprising contact layers, each of the contact layers being provided at each of the second contact parts, the contact layers being of the second conductivity type and the contact layers having a higher impurity concentration than the third semiconductor layer.

3. The semiconductor device according to claim 1, wherein the second contact parts are provided directly between the first semiconductor layer and the anode electrode.

4. The semiconductor device according to claim 3, wherein the first contact parts are provided directly between the first semiconductor layer and the anode electrode.

5. A semiconductor device comprising:
a first semiconductor element; and
a second semiconductor element,
the first semiconductor element including:
a first semiconductor layer made of $Al_xGa_{1-x}N$ ($0 \le x < 1$);
a second semiconductor layer provided on the first semiconductor layer and made of undoped or first conductivity type $Al_yGa_{1-y}N$ ($0 < y \le 1$, $x < y$);
an anode electrode and a cathode electrode, the anode electrode having a first surface which is provided directly on the second semiconductor layer, the cathode electrode having a second surface which is provided directly on the second semiconductor layer, and the second semiconductor layer including first contact parts which are directly in contact with the anode electrode; and
a third semiconductor layer of a second conductivity type provided between the anode electrode and the cathode electrode, the third semiconductor layer passing through the second semiconductor layer and reaching the first semiconductor layer, the third semiconductor layer including second contact parts which are directly in contact with the anode electrode, and the first contact part and the second contact part being alternately arranged along a direction which is orthogonal to a direction from the anode electrode to the cathode electrode and a direction from the first semiconductor layer to the second semiconductor layer,
the second semiconductor element including:
a fourth semiconductor layer made of $Al_zGa_{1-z}N$ ($0 \le z < 1$);
a fifth semiconductor layer provided on the fourth semiconductor layer and made of undoped or first conductivity type $Al_uGa_{1-u}N$ ($0 < u \le 1$, $z < u$); and
a source electrode and a drain electrode which are connected to the fifth semiconductor layer,
the anode electrode being connected to the source electrode through a first wire, and
the cathode electrode being connected to the drain electrode through a second wire.

6. The semiconductor device according to claim 5, wherein the second semiconductor element further includes a gate electrode provided between the source electrode and the drain electrode on the fifth semiconductor layer.

7. The semiconductor device according to claim 6, wherein a distance between the third semiconductor layer and the cathode electrode is shorter than a distance between the gate electrode and the drain electrode.

8. The semiconductor device according to claim 6, further comprising a gate insulating film formed between the fifth semiconductor layer and the gate electrode.

9. The semiconductor device according to claim 5, wherein
the source electrode forms Schottky contact with the fifth semiconductor layer, and
the drain electrode is electrically connected to a two-dimensional electron gas generated at an interface between the fourth semiconductor layer and the fifth semiconductor layer.

10. The semiconductor device according to claim 9, wherein a distance between the source electrode and the drain electrode is longer than a distance between the third semiconductor layer and the cathode electrode.

11. The semiconductor device according to claim 5, wherein the second contact parts are provided directly between the first semiconductor layer and the anode electrode.

12. The semiconductor device according to claim 11, wherein the first contact parts are provided directly between the first semiconductor layer and the anode electrode.

13. A semiconductor device comprising:
a first semiconductor layer made of $Al_xGa_{1-x}N$ ($0 \le x < 1$);
a second semiconductor layer provided on the first semiconductor layer and made of undoped or first conductivity type $Al_yGa_{1-y}N$ ($0 < y \le 1$, $x < y$);
an anode electrode, a cathode electrode, and a source electrode, the anode electrode having a first surface which is provided directly on the second semiconductor layer, the cathode electrode having a second surface which is provided directly on the second semiconductor layer, and the second semiconductor layer including first contact parts which are directly in contact with the anode electrode; and
a third semiconductor layer of a second conductivity type provided between the anode electrode and the cathode electrode, the third semiconductor layer passing through the second semiconductor layer reaching the first semiconductor layer, and the third semiconductor layer including second contact parts which are directly in contact with the anode electrode, and the first contact part and the second contact part being alternately arranged along a direction which is orthogonal to a direction from the anode electrode to the cathode electrode and a direction from the first semiconductor layer to the second semiconductor layer.

14. The semiconductor device according to claim 13, further comprising a gate electrode provided between the cathode electrode and the source electrode on the second semiconductor layer.

15. The semiconductor device according to claim 14, further comprising a fourth semiconductor layer of the second conductivity type formed in a region of the second semiconductor layer, the fourth semiconductor layer being directly below the gate electrode.

16. The semiconductor device according to claim 15, wherein an impurity concentration of the third semiconductor layer is lower than an impurity concentration of the fourth semiconductor layer.

17. The semiconductor device according to claim 15, wherein a length of the third semiconductor layer in a direction from the anode electrode to the cathode electrode is shorter than a length of the fourth semiconductor layer in a direction from the cathode electrode to the source electrode.

18. The semiconductor device according to claim 13, wherein the source electrode forms Schottky contact with the second semiconductor layer, and the cathode electrode is electrically connected to a two-dimensional electron gas generated at an interface between the first semiconductor layer and the second semiconductor layer.

19. The semiconductor device according to claim 13, wherein the second contact parts are provided directly between the first semiconductor layer and the anode electrode.

20. The semiconductor device according to claim 19, wherein the first contact parts are provided directly between the first semiconductor layer and the anode electrode.

* * * * *